(12) United States Patent
Serre et al.

(10) Patent No.: US 10,692,718 B2
(45) Date of Patent: Jun. 23, 2020

(54) POLYCRYSTALLINE SEMICONDUCTOR NANOSTRUCTURED MATERIAL

(71) Applicants: COMMISSARIAT A L'ENERGIE ATOMIQUE ET AUX ENERGIES ALTERNATIVES, Paris (FR); CNRS Centre National de la Recherche Scientifique, Paris (FR); INSTITUT POLYTECHNIQUE DE GRENOBLE, Grenoble (FR)

(72) Inventors: Pauline Serre, Sassenage (FR); Thierry Baron, Saint Egreve (FR); Celine Ternon, Saint Martin le Vinoux (FR)

(73) Assignees: COMMISSARIAT A L'ENERGIE ATOMIQUE ET AUX ENERGIES ALTERNATIVES, Paris (FR); CNRS Centre National de la Recherche Scientifique, Paris (FR); INSTITUT POLYTECHNIQUE DE GRENOBLE, Grenoble (FR)

(*) Notice: Subject to any disclaimer, the term of this patent is extended or adjusted under 35 U.S.C. 154(b) by 342 days.

(21) Appl. No.: 14/950,639

(22) Filed: Nov. 24, 2015

(65) Prior Publication Data
US 2016/0148807 A1    May 26, 2016

(30) Foreign Application Priority Data
Nov. 24, 2014    (FR) ...................... 14 61326

(51) Int. Cl.
| H01L 21/02 | (2006.01) |
| H01L 29/06 | (2006.01) |
| B82Y 10/00 | (2011.01) |
| H01L 29/41 | (2006.01) |
| H01L 29/16 | (2006.01) |
| B82Y 40/00 | (2011.01) |
| H01L 29/10 | (2006.01) |

(52) U.S. Cl.
CPC ........ *H01L 21/02603* (2013.01); *B82Y 10/00* (2013.01); *B82Y 40/00* (2013.01);
(Continued)

(58) Field of Classification Search
CPC ......... H01L 21/02603; H01L 21/02532; H01L 21/02576; H01L 21/02579;
(Continued)

(56) References Cited

U.S. PATENT DOCUMENTS

| 9,082,930 B1* | 7/2015 | Wacker | .................. H01L 35/34 |
| 2009/0142558 A1* | 6/2009 | Jiao | ........................ B82Y 30/00 428/206 |

(Continued)

FOREIGN PATENT DOCUMENTS

| WO | WO 2007/100551 A2 | 9/2007 |
| WO | WO 2010/040967 A1 | 4/2010 |
| WO | WO 2014/070611 A1 | 5/2014 |

OTHER PUBLICATIONS

French Preliminary Search Report with Written Opinion dated Aug. 10, 2015 in French Application 14 61326 filed on Nov. 24, 2014 (with English Translation of Categories of Cited Documents).
(Continued)

*Primary Examiner* — Brian K Talbot
(74) *Attorney, Agent, or Firm* — Oblon, McClelland, Maier & Neustadt, L.L.P.

(57) ABSTRACT

A method for producing a network of nanostructures from at least one semiconductor material, including a step of forming nanostructures on the surface of a substrate, at least a part of the nanostructures having areas of contact between each other, comprising, in sequence and after the step of forming: a step of deoxidising the surface of the nanostructures and a step of reinforcing the bond between the nanostructures at the contact areas.

21 Claims, 7 Drawing Sheets

(52) U.S. Cl.
CPC .. *H01L 21/02532* (2013.01); *H01L 21/02576* (2013.01); *H01L 21/02579* (2013.01); *H01L 21/02595* (2013.01); *H01L 21/02628* (2013.01); *H01L 21/02664* (2013.01); *H01L 29/0673* (2013.01); *H01L 29/1033* (2013.01); *H01L 29/16* (2013.01); *H01L 29/413* (2013.01)

(58) Field of Classification Search
CPC ......... H01L 21/02595; H01L 21/02628; H01L 21/02664; H01L 29/0673; H01L 29/1033; H01L 29/16; H01L 29/413; B82Y 10/00; B82Y 40/00
USPC .......................................................... 427/58
See application file for complete search history.

(56) References Cited

U.S. PATENT DOCUMENTS

| | | | | |
|---|---|---|---|---|
| 2010/0112373 | A1* | 5/2010 | Coffey | B32B 33/00 428/608 |
| 2010/0155691 | A1* | 6/2010 | Lee | G01N 27/127 257/9 |
| 2011/0001117 | A1 | 1/2011 | Lieber et al. | |
| 2011/0193053 | A1 | 8/2011 | Roca I Cabarrocas et al. | |
| 2013/0056244 | A1* | 3/2013 | Srinivas | G06F 3/041 174/250 |
| 2013/0146335 | A1 | 6/2013 | Gambino et al. | |
| 2013/0341074 | A1* | 12/2013 | Virkar | B82Y 30/00 174/255 |
| 2013/0342221 | A1* | 12/2013 | Virkar | G06F 3/041 324/661 |
| 2014/0042390 | A1 | 2/2014 | Gruner et al. | |
| 2014/0116491 | A1* | 5/2014 | Reifenberg | B82B 3/0014 136/203 |
| 2014/0290987 | A1* | 10/2014 | Yang | H01L 31/022466 174/253 |

OTHER PUBLICATIONS

Pauline Serre, et al., "Percolating silicon nanowire networks with highly reproducible electrical properties", Nanotechnology 26 IOP Publishing, vol. 26 (1), 2014, 10 pgs.

Yanli Zhao, et al., "Nanonet as a scaffold with targeted functionalities" Journal of Materials Chemistry, 2012, 9 pgs.

Celine Ternon, et al., "High aspect ratio semiconducting nanostructure random networks: highly versatile materials for multiple applications" Phys. Status Solidi RRL 7, (10), 2013, 6 pgs.

Celine Ternon, et al., "Carbon Nanotube Sheet as Top Contact Electrode for Nanowires: Highly Versatile and Simple Process", Journal of Nanoscience and Nanotechnology, vol. 14, 2014, 5 pgs.

Anuj R. Madaria, et al., "Large scale, highly conductive and patterned transparent films or sliver nanowires on arbitrary substrates and their application in touch screens", IPO Publishing Nanotechnology 22, 2011, 8 pgs.

Jung-Yong Lee, et al., "Solution-Processed Metal Nanowire Mesh Transparent Electrodes", Nano Letters, vol. 8, (2), 2008, 4 pgs.

Matthew A. Meitl, "Solution Casting and Transfer Printing Single-Walled Carbon Nanotube Films", Nano Letters, vol. 4, (9), 2004, 5 pgs.

Kwang Heo, et al., "Large-Scale Assembly of Silicon Nanowire Network-Based Devices Using Conventional Microfabrication Facilities", Nano Letters, vol. 8, (12), 2008, 5 pgs.

Somobrata Acharya, et al., "A Semiconductor-Nanowire Assembly of Ultrahigh Junction Density by the Langmuir-Blodgett Technique", Advanced Materials, (18), 2006, 4 pgs.

Zhuangchun Wu, et al., "Transparent, Conductive Carbon Nanotube Films", Science 27, vol. 305, (5688), 2004, 10 pgs.

Burcu Aksoy, et al., "Transparent, highly flexible, all nanowire network germanium photodetectors", IOP Publishing, Nanotechnology 23, 2012, 9 pgs.

Chaoyi Yan, et al., "Network-Enhanced Photoresponse Time of Ge Nanowire Photodetectors", School of Materials Science and Engineering, Nanyang Technological University, vol. 2, (7), 2010, 4 pgs.

Dongmok Whang, et al., "Large-Scale Hierarchical Organization of Nanowire Arrays for Integrated Nanosystems", Nano Letters, vol. 3, (9), 2003, 5 pgs.

Emre Mulazimoglu, et al., "Silicon nanowire network metal-semiconductor-metal photodetectors", Applied Physics Letters 103, 2013, 6 pgs.

Andreas Plößl, et al., "Wafer direct bonding: tailoring adhesion between brittle materials", Materials Science and Engineering, R25, 1999, 88 pgs.

F. Rieutord, et al., "Interfacial closure of contacting surfaces", A Letters Journal Exploring the Frontiers of Physics, EPL, 107, 2014, 7 pgs.

\* cited by examiner

710 — DEOXIDATION OF THE SEMICONDUCTOR MATERIAL COMPOSING THE NANONET.

For example, for a silicon nanonet, exposure to optionally diluted hydrofluoric acid (HF) vapor for 30 seconds.

720 — Annealing under a neutral atmosphere.

At a temperature above 300°C, preferably 350°C and ideally at a temperature of 400°C and for over 10 seconds, ideally for 1 minute

FIG.7

POLYCRYSTALLINE SEMICONDUCTOR NANOSTRUCTURED MATERIAL

TECHNICAL FIELD OF THE INVENTION

The present invention generally relates to <<nanonets>> from <<nanostructured network>> which refers to a network of structures having nanoscale dimensions (nanometre or nm=$10^{-9}$ metre), for example, a network of wires having nanoscale dimensions or nanowires. The invention more specifically discloses a method for producing such a network of nanostructures from one or more semiconductor material(s) on a substrate.

STATE OF THE ART

Nanonets attract considerable interest because of the very wide application spectrum they can cover, including electronics, optics, mechanics and chemistry and because new, generally smaller and very powerful devices, can be developed. They may be applied to extremely various fields such as, for instance, the production of energy from light or photovoltaic elements, the detection of chemical or biological species, the detection or the production of light.

Nanonets are generally classified in two categories schematically shown in FIGS. 1a and 1b. Manufacturing networks of such nanostructures randomly positioned on a substrate 100, from structures having nanoscale dimensions or unidimensional, also called <<1D>> nanostructures, having a high form factor, such as, for instance, a nanowire 101, i.e. a wire having nanoscale dimensions having a very high length/diameter ratio is known. As illustrated in FIG. 1a, the nanonets 110 having a thickness (i.e. the dimension along the thickness of the substrate) substantially equal to or slightly smaller than the length of the nanostructures are called three-dimensional or <<3D>> nanonets. On the contrary, as illustrated in FIG. 1b, the nanonets 120 having a thickness much smaller than the length of the nanostructures, i.e. nanowires in the present example, are called two-dimensional or <<2D>> nanonets.

The interest created by the utilisation of nanonets, and more particularly 2D type nanonets in the production of all kinds of devices such as those mentioned above, comes from the very interesting properties which can be obtained from assembling such nanostructures.

Such properties are different and include the opportunity to obtain: a large specific surface area and high porosity; a good electrical conductivity and a good optical transparency. Besides, the nanonets can be both mechanically resistant and flexible: a nanonet made of correctly interleaved 1D nanostructures is very flexible as compared to thin films. It has been demonstrated that such a network structure can conform to a substrate morphology without breaking and may be used to form a so-called suspended mechanical system. Additionally, as the nanonets include millions of 1D nanostructures, a good reproducibility and a high fault tolerance are de facto obtained on a macroscopic scale. As a matter of fact, the properties which can be observed in nanonets result from a statistic combination of the properties of a very large number of individual nanostructures, i.e. an average thereof, which is thus much more reproducible than those of individual nanostructures and a defective nanostructure entails no major default. High quality components can thus potentially be obtained since synthesizing 1D structures having large flawless areas, which makes it possible to enhance the electrical and optical properties of nanonets, is relatively easy. Besides, in nanowires with small diameters, quantum effects may appear, which the corresponding nanonet can thus take advantage of. Eventually, nanonets can be functionalized by bonding chemical species or nanoscale materials, such as nanoparticles, with the nanostructures of a nanonet. Other properties are then added to the nanonet thanks to synergy between the nanoparticles and the 1D nanostructures.

Assembling the 1D nanoparticles to form a nanonet is a critical step which determines the final properties of the networks obtained. Reliable, simple and little expensive production techniques have thus been developed. Various methods exist for preparing nanonets such as for example the direct growth of networks generally obtained by <<chemical vapor deposition>> or CVD. Self-assembling of nanostructures from a solution of the latter has often been preferred in the last few years. As a matter of fact, if direct growth most often results in 3D nanonets, the large scale integration of which is limited by complex and expensive technological steps, methods using the self-assembling of the nanostructures present in a solution can be implemented at room temperature and at low cost.

2D nanonets as illustrated in FIG. 1b consisting of nanowires 101 or nanotubes randomly oriented on a substrate can thus be obtained rather quickly and for a low cost using many different techniques, from liquid solutions, such as <<spray coating>>, <<drop casting>>, <<spin coating>>, nanostructures, self-assembling on a chemically modified substrate, so-called Langmuir-Blodgett technique by immersion of a solid film into a liquid or vacuum filtering deposition.

Although a very rich literature exists, which results from research and development and describes the characteristics of and the means for obtaining 2D nanonets from carbon nanotubes and silver or copper nanowires, for instance, mainly for obtaining conductive transparent materials, (almost) no mention is made of the way to obtain semiconductor nanonets. As a matter of fact, the utilisation of semiconductor nanonets seems much limited for electric applications because of the low conductivity of the nanonets made from semiconductors. Silicon and germanium very quickly oxidise in the open air. An oxide layer then appears at the nanowire-nanowire junctions, which prevents any current from flowing therebetween.

Publication WO2014070611 A1 discloses a method for assembling nanowires using significant heating and optionally deoxidation of the assembled structure. Such document does not solve the problem of the significant electrical discontinuity between the nanowires, or else at a very high cost in terms of heating.

One aim of the invention is thus to disclose a method which extends the applications of nanonets produced from semiconductors, while improving the electrical conductivity thereof. One object of the invention thus more specifically relates to the disclosure of a method enabling to develop silicon and germanium nanonets which remain stable in an oxidizing atmosphere in the long term, and which let a significant electric current through on inter-electrode distances which are much greater than the length of the nanowires they are made of, i.e. while making it possible to effectively use such nanowires as a network and not use these for the individual properties thereof, only.

Other objects, characteristics and advantages of the present invention will become apparent upon examining the following description and the appended drawings. It should be understood that other advantages may be included.

SUMMARY OF THE INVENTION

One aspect of the invention is a method for producing a network of nanostructures from at least one semiconductor material, comprising a step of forming the nanostructures on the surface of a substrate, with at least a part of the nanostructures having areas of contact between each other. It advantageously comprises, in sequence and after the step of forming:

a step of deoxidising the surface of the nanostructures;
a step of reinforcing the bond between the nanostructures at the contact areas.

Whereas the state of the art has developed some prejudice which consists in considering that the nanostructures made from semiconductors cannot be used in high performance electric applications, the invention opposes such prejudice with a step of deoxidation followed by the reinforcement of bonds between the nanostructures, with such step avoiding any subsequent reoxidation of the contact areas between the nanostructures.

According to one aspect of the invention, deoxidising, prior to reinforcing the bond, makes it possible to prepare such bond at best, as regards the junction electric continuity, without requiring an even local melting of the material at the junctions between the nanostructures.

Whereas WO2014070611 A1 considers deoxidising after reinforcing the bond, and because of the state of the outer surface (more particularly in order to establish a contact between the outer surfaces of the nanostructures and other components in a device), the invention objects such prejudice and executes deoxidation as a preliminary step to bond reinforcing, and because of the electric continuity between the nanostructures, which is thus different both in terms of function and of result.

According to one aspect, reinforcing the bond comprises a heat treatment in the form of annealing. The bond can thus be reinforced without too important additional heat. Such treatment or annealing is further preferably executed at an advantageously relatively low temperature, i.e. more specifically lower than a melting, or even a creep temperature of the material of a nanostructure at the junction. Such temperature may be less than 600° C., preferably above 300° C. Preferred temperatures range from 400° C. to 450° C.

The invention also relates to a network of nanostructures and a device comprising a substrate and a network of nanostructures obtained with the method of the invention. Another aspect of the invention is a network of nanostructures wherein the internanostructures contact areas have been deoxidised.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIG. 7 summarizes possible steps according to the method of the invention.

Figure 1A:
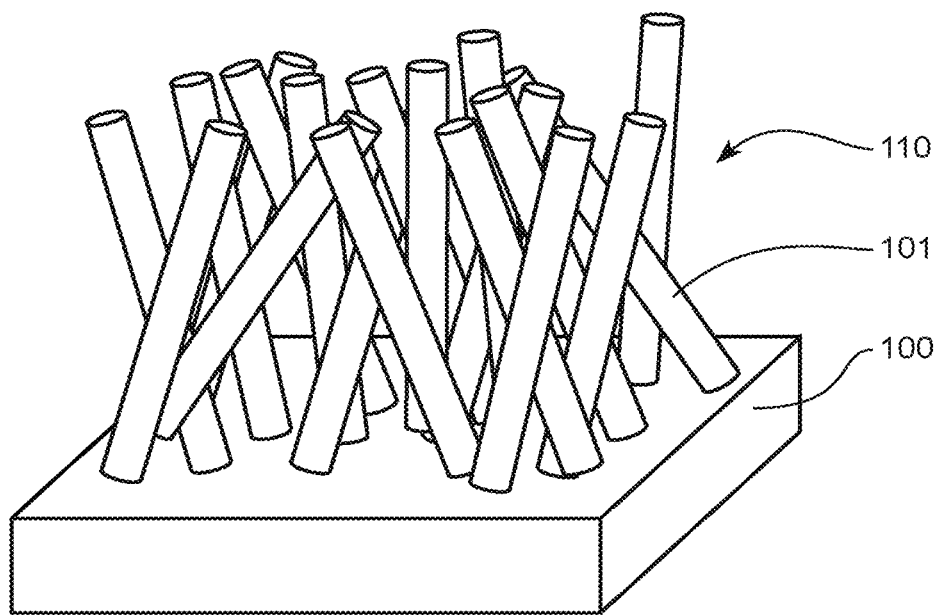
FIGS. 1a and 1b show nanonets having different structures.

The drawings attached are given as examples and are not limiting to the invention.

DETAILED DESCRIPTION OF THE INVENTION

Before going into the details of embodiments of the invention, more particularly with reference to the figures, purely optional characteristics which can be implemented in combination or alternatively are enumerated hereunder:

the step of reinforcing the bond comprises a heat treatment;
the heat treatment is in the form of annealing, preferably at a temperature above 300° C.;
the heat treatment has a duration of more than 10 s;
the heat treatment has an ideal duration of one minute;
the heat treatment is executed under a neutral atmosphere;
the heat treatment is executed less than 72 hours, and advantageously less than one hour, preferably less than a quarter of an hour after the step of deoxidising;
the step of reinforcing the bond is so configured as to result in the sintering or a direct gluing at the contact areas.
the step of deoxidising comprises exposing the nanostructures to a jet of vapor of an acid solution, or to a liquid phase of an acid solution;
the nanostructures are exposed to the jet of acid vapor for at least 30 s, with the acid vapor preferably having a concentration ranging from 40% to 60%;
hydrofluoric acid or a solution of hydrofluoric acid and ammonium fluoride are used for the step of exposure;
the nanostructures formed are nanowires;
more particularly in the case of 10 µm long nanowires (or having a length ranging from 8 to 12 µm), a density of nanowires in the network is selected to be above $8.10^6$, advantageously at least $13.10^6$ nanowires.cm² and preferably equal to $27*10^6$ nanowires per cm². In the case of nanowires having a different length, reference may be made to the percolation theory, described hereunder, to determine the minimum density authorising conduction.

The method comprises a step of forming at least one electric contact layer on the nanostructures after the step of deoxidising;
the step of forming at least one electric contact layer is preferably executed prior to the step of reinforcing, while avoiding any intermediate oxidation;
a substrate comprising a superficial insulating layer is used;
the step of forming the nanostructures is carried out from silicon and/or germanium and/or a silicon and germanium alloy;
p-doped nanostructures forming a first sub-network, and n-doped nanostructures forming a second sub-network are formed, with the first and second sub-networks having contact areas; The first sub-network may be formed prior to or after the second sub-network.
the first and second sub-networks are bonded by means of a heat treatment.
reinforcing the bond may comprise a heat treatment executed at an advantageously relatively low temperature, i.e. more specifically lower than a melting, or even a creep temperature of the material of a nanostructure at the junction.

the heat treatment temperature may be lower than 600° C., preferably above 300° C. A preferred range of temperatures is 400° C. to 450° C.; using low temperatures makes it possible not to affect the specifically optical and/or electrical properties of the network.

Generally speaking, after forming the nanostructures, the invention comprises steps which make it possible to establish a satisfactory electrical continuity between the nanostructures, for electrical applications. To reach this goal, the invention provides for a deoxidation of the nanostructures, followed by a step of reinforcing the inter-nanostructures bonds. These combined steps provide the desired electrical continuity whereas deoxidising alone would have been considered as useless because of the re-oxidation that would follow.

Nanostructures can be obtained using any current technology and the invention can be used for any nanostructure configuration, and not only for nanonets. The networks illustrated in FIGS. 1a and 1b may be obtained. The word <<nanostructure>> more specifically means structures having nanoscale dimensions, for example ranging from 1 to 1,000 nanometres in at least one of its directions.

After deoxidising, the invention comprises a step of reinforcing the bond, at the contact areas between the nanostructures of the network. Whereas such bond could mainly be a simple mechanical support, the reinforcement produces a more resisting bond, especially using molecular bonding, by applying Van der Waals forces, via sintering or direct, for example hydrophobic, gluing. The words <<reinforcing the bonds>> mean any technique which enhances the resistance of the interface between the nanostructures at the contact areas.

The step of reinforcing is not necessarily executed immediately after the step of deoxidising.

FIGS. 2a to 2d illustrate steps of the method according to the invention. They correspond to an exemplary implementation thereof for nanonets-based devices, the density of which is, in this example $27 \times 10^6$ nanowires per $cm^2$ and wherein the nanowires are made of silicon. In this embodiment, the integration process comprises the steps described hereunder.

First, in step 210, networks 212 of nanowires, for instance 211, are transferred to a silicon substrate 200 coated with a thin film 202 of silicon nitride (Si3N4), 208 nm thick in this example.

Then, in the following step 220, the nanonets are exposed for 30 s to hydrofluoric (HF) acid or a solution of hydrofluoric acid and ammonium fluoride vapor 222. A solution of hydrofluoric (HF) acid diluted from 30% to 70% and advantageously from 45% to 55% can be used for generating such vapor; dilution is 49% in this example. Such treatment makes it possible to eliminate the native oxide which is a few nanometres thick, an oxide which spontaneously forms in the presence of air and which covers the whole surface of the silicon nanowires. This makes it possible to obtain a direct contact between the silicon nanowires and will also advantageously make it possible to ensure a good electric contact with the metal electrodes which will be deposited during the following step.

Immediately afterwards, in this embodiment, in step 230, the metal contacts are deposited 232 onto the nanonets through an evaporation mask 234, using an electron beam evaporator. The deposition of contacts comprises the deposition of a layer, for instance 120 nm thick, of nickel (Ni), a layer, for instance 180 nm thick, of aluminium (Al) and a layer, for instance 50 nm thick, of gold (Au).

Figure 2A:
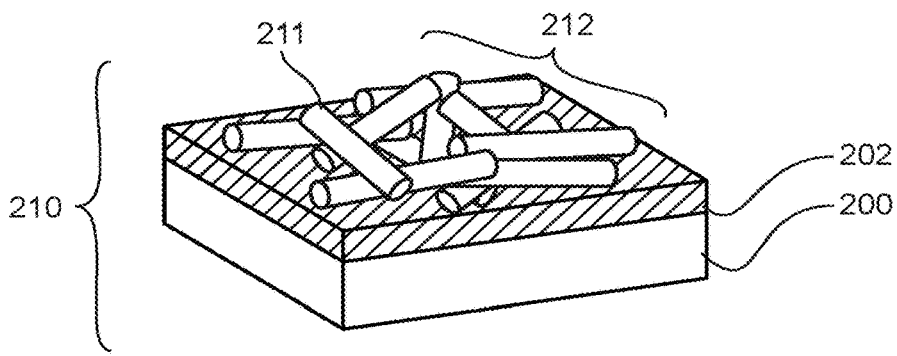
FIGS. 2a to 2d illustrate steps of forming a nanonet consisting of nanowires made of a semiconductor material, according to the method of the invention.
Figure 2B:
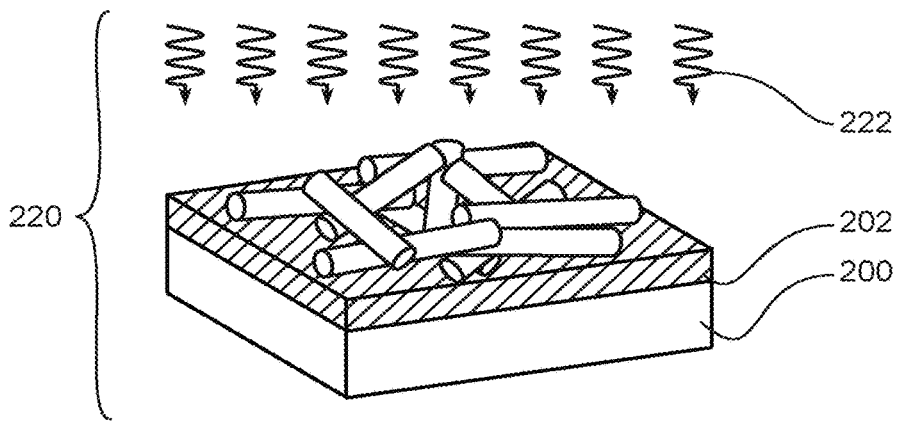
Figure 2C:
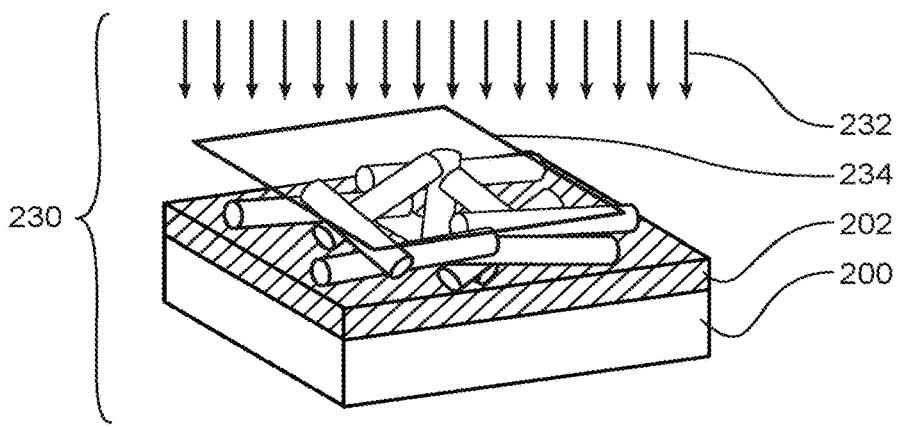
Figure 2D:
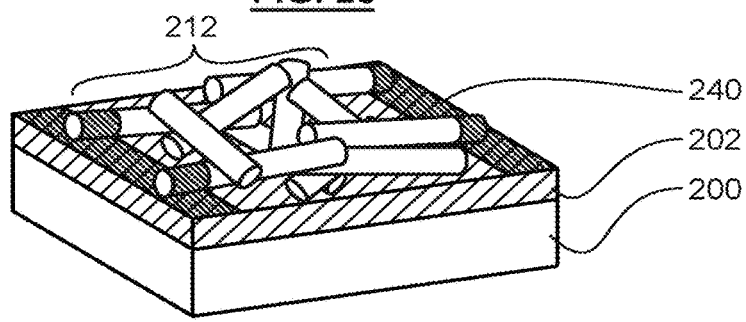

The result is as shown in FIG. 2d, where the contacts 240 are positioned on either side of the nanowire 212 and ensure a good electric contact with the latter. The device of FIG. 2d is here a simple test structure.

The metal contacts may also be provided after the reinforcing step described hereunder. Such contacts may thus be produced either before, or after the reinforcing step.

Figure 3A:
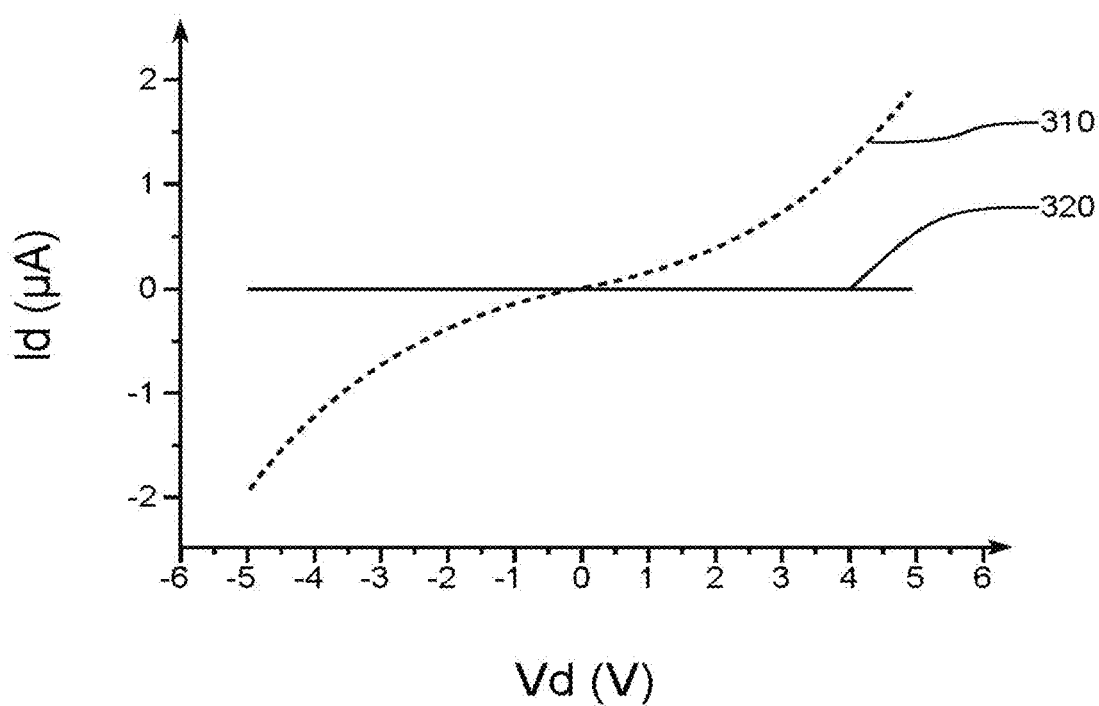
FIGS. 3a and 3b show results of the electrical conductance of nanonets produced while including the step of deoxidising according to the method of the invention.
Figure 3B:
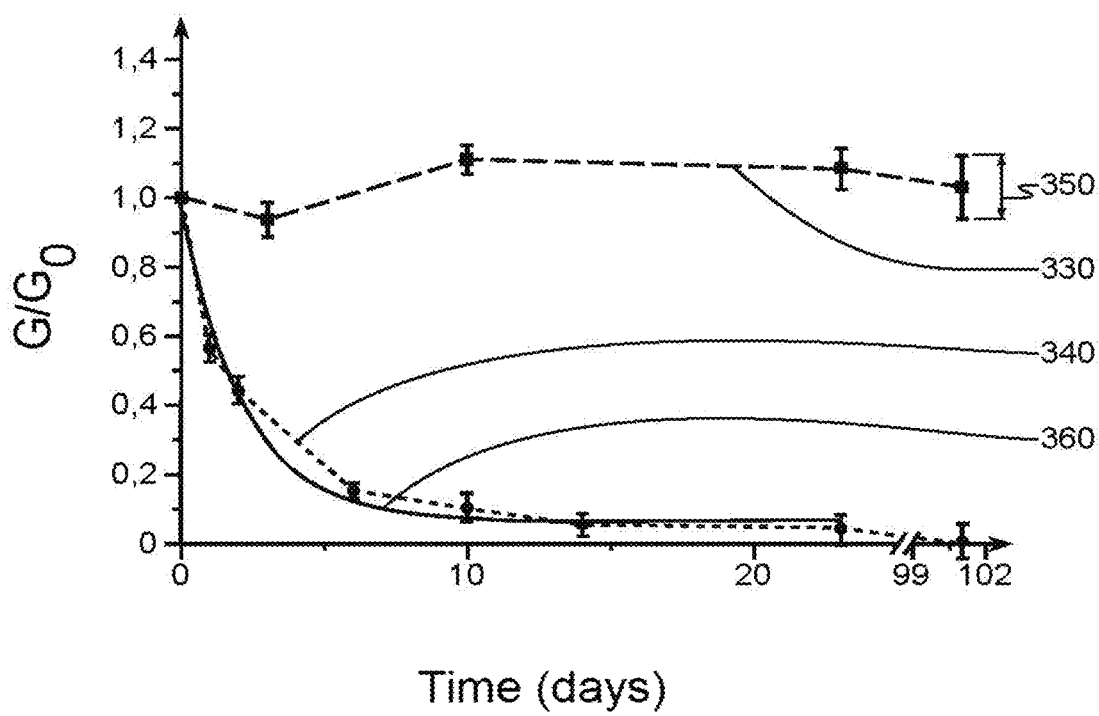

FIGS. 3a and 3b respectively illustrate, on the one hand, a typical current-voltage characteristic obtained with the type of devices produced using the method disclosed in the preceding figure, and on the other hand, the time evolution of the electrical properties of conductivity depending on the atmosphere wherein the device is kept.

FIG. 3a shows that the conduction of the nanonet is bidirectional and substantially identical, whatever the applied polarity. The current-voltage curve 310 is typical of a network of degenerate silicon nanowires, for instance obtained by a vapor liquid solid growth, of the n type, for example with a doping of $10^{19}$ atoms per $cm^3$ with an inter-electrode distance of 50 µm (µm or micron i.e.: $10^{-6}$ meter). Using doped semiconductors is in no way restrictive to the invention and the latter is further advantageous in that it produces networks of nanostructures with properties of semi-conductivity, from non doped semiconductors. As mentioned above in FIG. 1, the density of nanowires is $27 \times 10^6$ nanowires per $cm^2$ in the example above. The same current-voltage curve, with no silicon nanonet, is also drawn in this graph, and bears reference 320.

For information, a density of nanowires above the limit of the percolation threshold may be selected for the density of nanowires of the invention.

The percolation threshold, dc, can be defined using the percolation theory, according to the length of the nanostructures, $L_{NF}$, by:

$$d_c = \frac{4.326^2}{\pi L_{NF}^2}$$

(Formula from Hu et al. 2004 Nano Letters. 4 No. 12 2513-2517)

No maximum density exists, as regards electrical conduction, knowing that percolation laws apply between 5 dc and 7 dc; beyond such range, the network behaves as a solid, which may be as interesting.

FIG. 3b shows the time evolution (in days) of the standardized conductance ($G/G_0$) at −5 V for nanonets stored, on the one hand, in nitrogen 330 and, in the other hand, in the open air 340. The variable conductance obtained for three different nanonet-based devices with the same nanowire density, i.e.: $27 \times 10^6$ nanowires per $cm^2$, is indicated by the intervals, for example, 350. The curve 360 corresponds to the exponential adjustment of conductance decay over time in the silicon nanonets stored in the open air.

FIGS. 3a and 3b show that, because of the treatment with HF vapor, carried out in step 220 prior to the deposition of metal electrodes, the silicon nanowires are initially passivated by Si—H bonds. Initially, the thickness of oxide around the nanowires is usually very thin, of the order of a few angstroms (angstrom=$10^{-10}$ metre) or even zero. When kept in a neutral atmosphere, for instance nitrogen, the surfaces are not modified and current remains stable, as shown by the curve 330. On the contrary, in the presence of oxygen, the surfaces oxidise and current quickly drops to reach zero, as shown by the curve 340. It can be noted, however, that the treatment with HF vapor 220 which also results in a passivation of the nanowires, makes it possible to slow down the oxidation at the nanowire-nanowire junctions with a time constant of 3 days, as compared to only a few hours, as noted for nanowires having a 85 nm diameter, as can be seen with the curve 360.

Figure 4A:
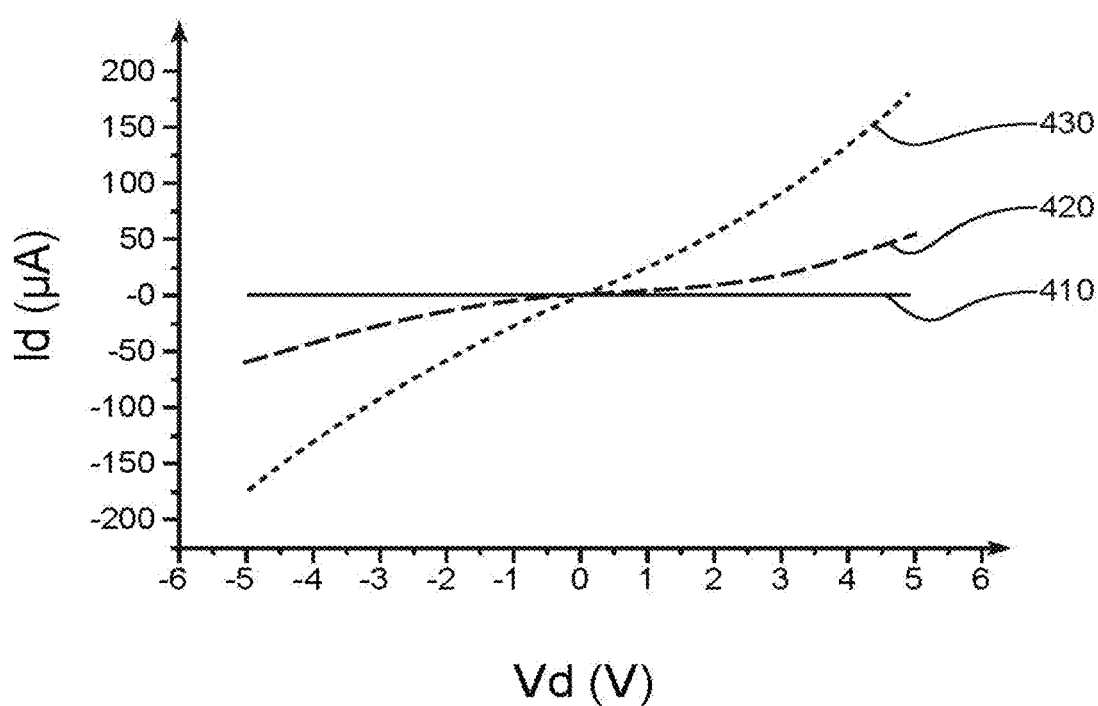
FIGS. 4a and 4b show results of the electrical conductance of nanonets produced while also including the step of thermal annealing according to one aspect of the method of the invention.
Figure 4B:
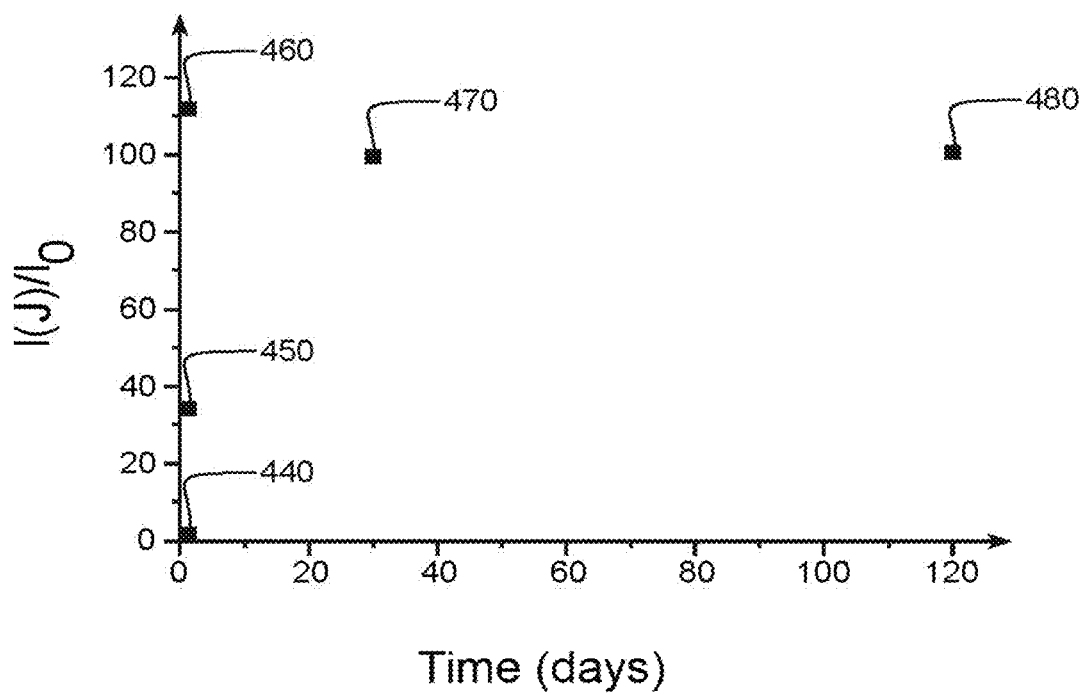

FIGS. 4a and 4b then illustrate the electrical properties obtained with nanonets whereon all the steps of the method according to the invention have been applied, and not only the step of deoxidising 220, the effects of which have been shown in the preceding figures. Such properties are studies upon completion of each step of the method, and then over time, for several months.

Figure 1B:
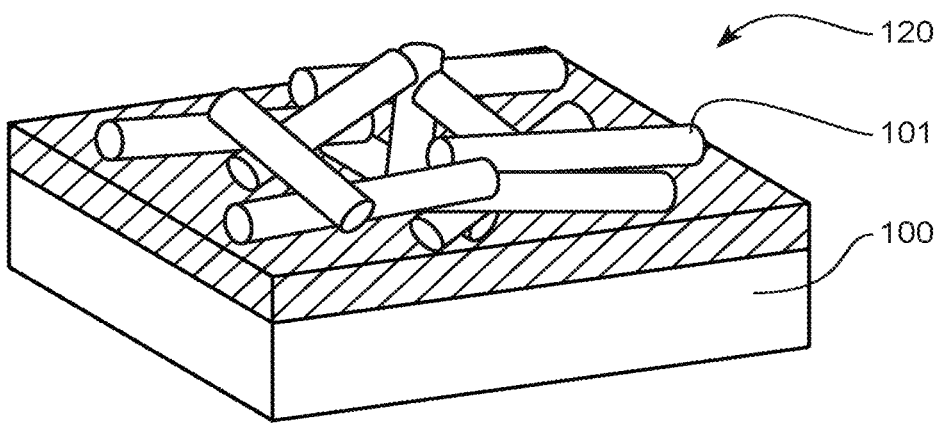

Firstly, as already described for step 220, a vapour phase treatment with 49% diluted hydrofluoric acid (HF), is executed for 30 seconds on nanonets of the same type as those illustrated in FIG. 1b in order to remove the native oxide at the junctions between the silicon nanowires. As seen above, a direct contact between the silicon nanowires can thus be obtained. The current-voltage characteristics of the studied nanonets which can be seen in FIG. 4a show that an increase in current by one order of magnitude 420 can be noted after such operation as compared to the reference curve 410 which corresponds to the initial conduction of the nanonets prior to the HF treatment. It should be noted here that the current-voltage characteristic 420 remains non linear, like in FIG. 3a.

Secondly, annealing is carried out, for example at a temperature of 400° C. for at least 1 minute, in a nitrogen atmosphere in order to obtain siliconized contacts at the nickel-silicon nanowire (Ni—SiNW) interface and the nanowires are bonded together at the nanowire-nanowire (NW-NW) junctions. Upon completion of such annealing, it can be seen that the measured current increases again by one order of magnitude and it can also be noted that the current-voltage characteristic obtained 430 is now substantially linear.

The annealing time mentioned above is not restrictive but is a compromise between the duration of the heat treatment and the dimension of the stabilized interface between the nanowires (at the neck level). Depending on the desired results, duration may range from 10 seconds to 3 hours or more.

Eventually, the long-term stability of such optimized devices has been studied when storing these in the open air for up to 120 days. The graph in FIG. 4b summarizes the evolution of the standard −5 V current at the value noted on the first day, i.e. $I_{(j)}/I_{(0)}$). The initial value of current on the first day 440, before any treatment is applied to the nanonets, and the one after HF deoxidation 450 thereof are mentioned for comparison. Upon completion of the annealing at 400° C. the values observed on the first day of storage, after 30 days and after 120 days, i.e. respectively 460, 470 et 480, are mentioned.

Current in the optimised devices 460 has thus been multiplied by 100 as compared to the not treated devices 440. Only a slight reduction in the current can be observed 470 during the first days, but current then stabilises 480 in spite of the fact that the nanonets are stored in the open air, i.e. in an oxidizing medium.

Observations with a high resolution transmission electron microscopy (HRTEM) have been made to demonstrate that the gluing of the nanowires is effective and access the structure of the NW-NW junctions. For this purpose, silicon nanonets-based samples, both annealed and not annealed, stored for several months in an oxidizing atmosphere, have been prepared in transverse sections to be analysed using a so-called FIB-SEM technique wherein a <<focused ion beam>> or FIB is used, using a <<scanning electron microscope>> better known by the acronym SEM.

Figure 5A:
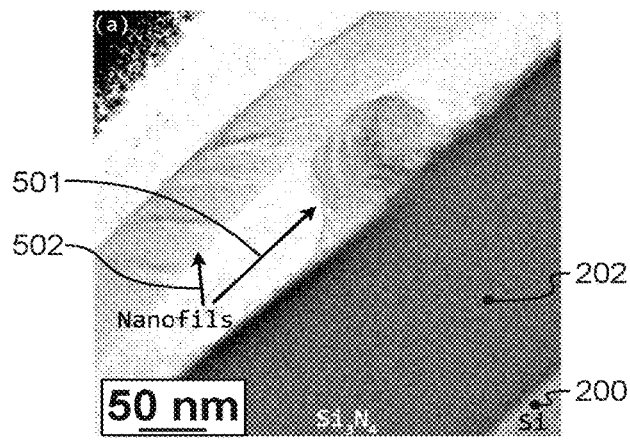
FIGS. 5a to 5d show micro-photographs of junctions between nanowires of nanonets whereon the step of deoxidising has been executed.
Figure 5B:
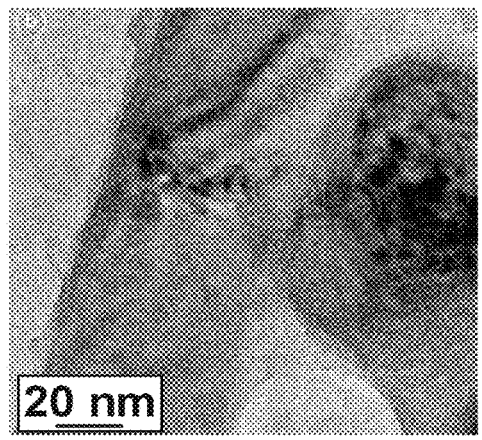
Figure 5C:
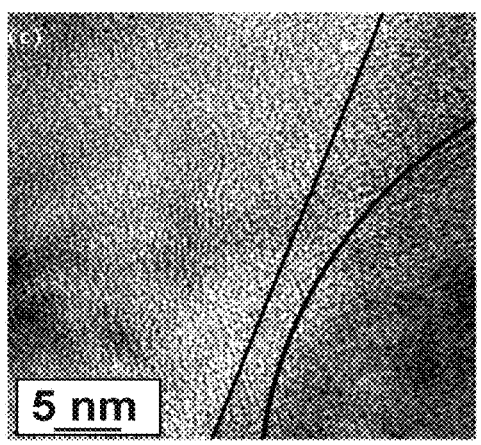
Figure 5D:
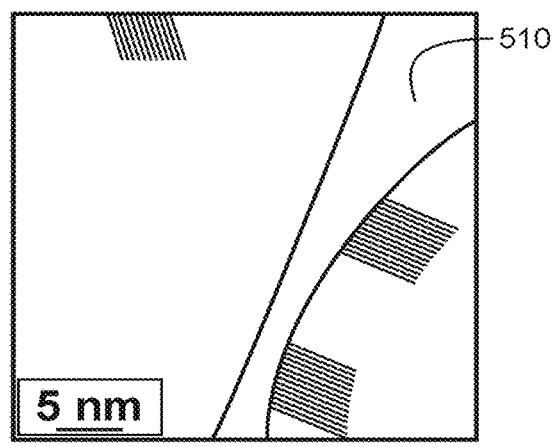

Firstly, the structural properties of a NW-NW junction, within a not annealed nanonet stored for several months in the open air, have been analysed. FIG. 5, which consists of FIGS. 5a to 5d, shows the images obtained by high-resolution electron emission microscopy of a not annealed NW-NW junction. The image of FIG. 5a is an overall view of the observed area. The silicon substrate 200 covered with a thin film 202 of silicon nitride, 192 nm thick, in this example, and the two studied nanowires can be seen therein. The perpendicular leafed nanowire 501, 67 nm in diameter, is slightly skew, which explains the presence of several circular projections representing the front and the back of such nanowire. The parallel leafed nanowire 502, 60 nm in diameter, is slightly curved, because it is positioned above the other nanowire. Such curvature induces constraints within the network which result in dark contrasts along such nanowire. FIGS. 5b and 5c show the interface between the two nanowires. FIG. 5c shows such high magnification interface at the contact areas thereof. Eventually, FIG. 5d is an interpretation of what can be seen in FIG. 5c, i.e. the one at a higher magnification. It can be seen that the two nanowires are spaced by approximately 2 nm of amorphous material 510, which is probably silicon oxide formed when exposing the nanonets to the oxygen from the air. Insulating material is thus present at the NW-NW junctions, within a not annealed nanonet stored in the open air.

Figure 6A:
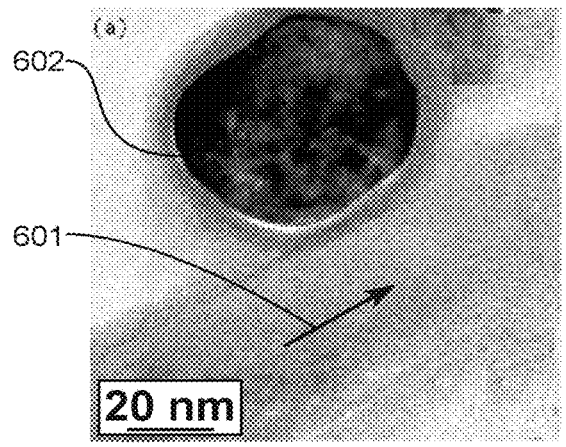
FIGS. 6a to 6d show micro-photographs of junctions between nanowires of nanonets whereon the steps of deoxidising and thermal annealing have been executed.

Secondly, the structural properties of a NW-NW junction within a nanonet annealed at 400° C. for one minute after having been exposed, as mentioned above, to hydrofluoric acid vapor and then stored for several months in the open air are shown. FIG. 6, which consists of FIGS. 6a to 6d, shows the images obtained by high-resolution electron emission microscopy of the annealed NW-NW junction. The image of FIG. 6a is an overall view of the observed area wherein a longitudinal nanowire 601 can be seen, the crystalline silicon of which has a diameter of 41 nm and the silica shell a thickness of about 8 nm. Such nanowire is crystallized, as evidenced by the presence of crystallographic planes in the image. A slightly flattened transverse nanowire 602 has a core maximum diameter of 54 nm and a silica shell of about 6 nm in thickness. The nanowire is also a single-crystal nanowire.

Figure 6B:
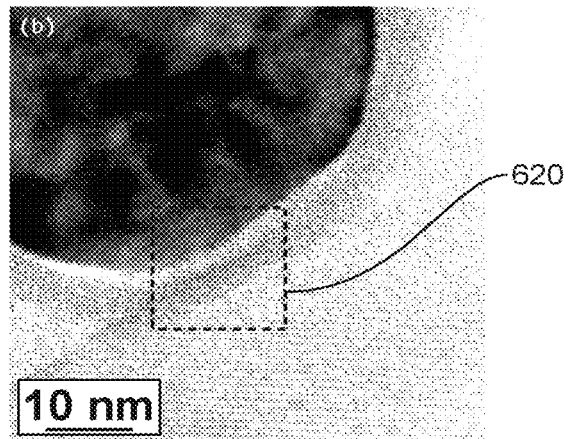
Figure 6C:
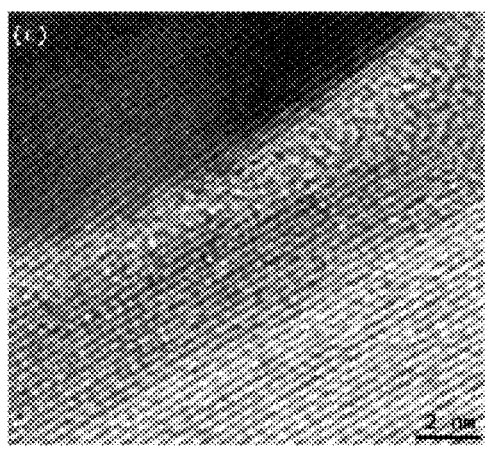
Figure 6D:
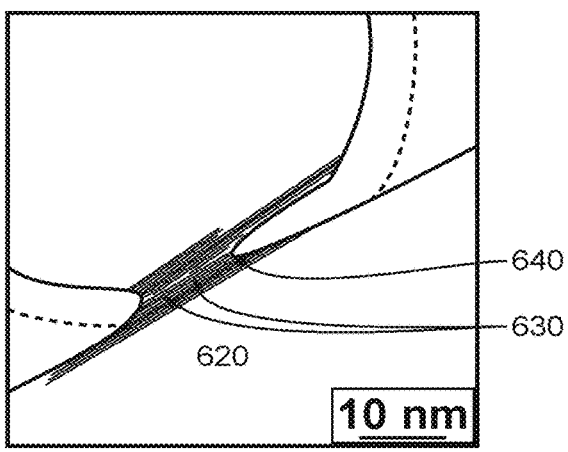

FIGS. 6b and 6c show the interface between the two nanowires, with FIG. 6c showing a greater magnification view of the contact area 620 between the nanowires. FIG. 6d is an interpretation of what can be seen in FIG. 6b. On both micrographs, continuity can be observed between the crystallographic planes 111 of the transverse nanowire and those of the longitudinal nanowire at the junction with the appearance of two dislocations 630. Continuity therefore exists in the silicon crystalline network, at the junction. A neck 640, i.e. an interface area formed by annealing, has thus been formed, with a width of approximately 11 nm between the two nanowires. Then, when exposed to air, the surfaces of the nanowires oxide without however affecting the interface between the nanowires since these have been bonded as a result of annealing.

The nanonets deoxidized by the hydrofluoric acid vapor during annealing at 400° C. thus obviously undergo natural sintering or direct hydrophobic gluing which results in a neck 640 appearing, which is about ten nanometres in dimensions. Because of such gluing, oxidation at the junctions can no longer occur, since the nanonet then consists in a polycrystalline assembly of silicon wherein all the nanowires are bonded together, as shown by the continuity of the atomic planes in FIG. 6c.

On the contrary, as seen in FIGS. 5a to 5d, in the absence of annealing, oxidation occurs at the interfaces between the nanowires, thus causing the generation of silica between each nanowire of the nanonet, which prevents current from flowing.

The direct gluing of the nanowires at the junctions is a clear evidence that the current flowing in the nanonets can be increased by two orders of magnitude and that substantially linear current-voltage characteristics 430 can be obtained as shown in FIG. 4a.

The principle of the invention consists in applying a sequence of chemical and heat treatments after assembling the silicon nanonet on the substrate in order to first deoxidize the nanowires of the network and then to enable the sintering or molecular bonding of the network at the nanowire-nanowire junctions. The network of nanowires is thus transformed into a polycrystalline silicon network and a subsequent oxidation of the nanonet results in oxidation on the surface and no longer at the nanowire-nanowire junctions. The electrical properties of the nanonet thus remain stable over time, including under an oxidising atmosphere.

The steps of the method of the invention which are executed after the nanonet has been formed are summarized in FIG. 7, according to one embodiment.

During a first step 710, the semiconductor material constituting the nanonet, for instance made of silicon, is deoxidised by being exposed for 30 seconds to optionally diluted hydrofluoric acid (HF) vapor, or using any other suitable vapor-phase deoxidising process. A liquid-phase treatment may also be used. However the vapor-phase will entail less damages to the network.

During a second step 720, annealing is carried out at a temperature above 300° C., preferably 350° C. and ideally at a temperature of 400° C. under a neutral atmosphere and for a duration of more than 10 seconds, ideally for 1 minute.

It should be noted here that an alternative embodiment of the method of the invention consists in shifting the time when the nanowires gluing operation, i.e. annealing, is carried out. As a matter of fact, this operation may be carried out prior to depositing the metal electrodes or afterwards. In the preceding examples, it was applied after the deposition of the electrodes since the metal contact siliconizing can thus be executed at the same time. The treatment must then be executed prior to or after the deposition of the nanonet electrodes, depending on whether the contacts are desired to be annealed or not.

The advantage of the invention is thus a long-term preservation of the electrical properties of the nanonets made of semiconductor material, for instance those made of silicon nanowires, using an operation like hydrophobic direct gluing or natural sintering. However, the preparation technique used (deoxidation) and the low operating temperature, specifically above 300° C., preferably 350° C. and advantageously equal to 400° C., result in the invention requiring a low heat budget.

The potential applications of the method of the invention are numerous, for instance:

for producing semi-transparent solar cells by combining n-doped nanonets and p-doped nanonets which are subsequently bonded together using a heat treatment. The advantages entailed in using semiconductor nanonets reside in that a better collection of light thanks to geometry, a multiplication of the PN junctions at each contact point and a reduced distance to be travelled by the carriers, can be obtained. If the nanowires used have a sufficiently small diameter, i.e. smaller than 10, which may result in quantum confinement effects, a direct bandgap is created which will enable a better absorption. The mechanical flexibility of the nanonets also makes it possible to imagine new geometry.

for detecting biological or chemical species. Using surface functionalization, the nanonet can be made sensitive to a large variety of species which will modify surface properties of the nanonet and thus the electrical properties thereof. The smaller the diameter of the nanowires, the greater the effects since surface becomes dominant relative to volume. Then the nanonet geometry results in a larger specific surface which increases the sensitivity thereof. Transparency and flexibility may also be advantageous for such type of applications for producing flexible electronic systems. The method of the invention makes it possible to produce flexible and semi-transparent semiconductor materials which may be used in the composition of flexible transistors, insensitive to ultra-violet (UV) rays and which do not deteriorate in the presence of oxygen, which is the soft spot of the organic materials generally used for such type of application.

for producing photodetectors. As a matter of fact, the conductivity of a silicon nanonet is modified according to the lighting thereof, which makes it possible to produce high response rate photodetectors, thanks to the geometry thereof.

The invention claimed is:

1. A method for producing a network of nanostructures from at least one semiconductor material, comprising:
    forming the nanostructures on a surface of a substrate, with at least a part of the nanostructures having contact areas between each other,
    after said forming, reinforcing a bond between the nanostructures at the contact areas, wherein said reinforcing comprises a heat treatment in the form of annealing, and
    after said forming and prior to said reinforcing, deoxidising the surface of the nanostructures.

2. The method according to claim 1, wherein the heat treatment is executed at a temperature of less than 600° C.

3. The method according to claim 1, wherein the heat treatment is executed at a temperature above 300° C. to 450° C.

4. The method according to claim 1, wherein the heat treatment has a duration of more than 10s.

5. The method according to claim 1, wherein the heat treatment has a duration of one minute.

6. The method according to claim 1, wherein the heat treatment is executed under a neutral atmosphere.

7. The method according to claim 1, wherein the heat treatment is executed less than 72 hours after said deoxidising.

8. The method according to claim 1, wherein the reinforcing the bond results in the sintering or a direct gluing at the contact areas.

9. The method according to claim 1, wherein the deoxidising comprises exposing the nanostructures to a jet of vapor of an acid solution.

10. The method according to claim 9, wherein the nanostructures are exposed to the jet of acid vapor for at least 30s.

11. The method according to claim 9, wherein the nanostructures are exposed to a jet of vapor of hydrofluoric acid or to a jet of vapor of a solution of hydrofluoric acid and ammonium fluoride.

12. The method according to claim 1, wherein the nanostructures are nanowires.

13. The method according to claim 12, wherein a density of nanowires in the network is $13 \times 10^6$-$27 \times 10^6$ nanowires per $cm^2$.

14. The method according to claim 1, further comprising forming at least one electric contact layer on the nanostructures after said deoxidizing.

15. The method according to claim 14, wherein the forming at least one electric contact layer is executed prior to the reinforcing.

16. The method according to claim 1, wherein the substrate comprises a superficial insulating layer.

17. The method according to claim 1, wherein forming the nanostructures is carried out from a silicon, a germanium, or a silicon and germanium alloy.

18. The method according to claim 1, comprising forming p-doped nanostructures forming a first sub-network, and n-doped nanostructures forming a second sub-network, with the first and second sub-networks having contact areas.

19. The method according to claim 18, wherein the first and second sub-networks are bonded by means of a heat treatment.

20. The method according to claim 14, wherein the forming at least one electric contact layer is performed after said reinforcing.

21. The method according to claim 1, wherein:
the heat treatment is executed less than 72 hours after said deoxidizing;
the reinforcing the bond results in the sintering or a direct gluing at the contact areas;
the deoxidising comprises exposing the nanostructures to a jet of vapor of an acid solution; and
the nanostructures are exposed to the jet of vapor of an acid solution for at least 30s.

* * * * *